United States Patent
Chan et al.

(10) Patent No.: US 7,982,129 B2
(45) Date of Patent: Jul. 19, 2011

(54) PHOTOVOLTAIC CELLS WITH INTERCONNECTS TO EXTERNAL CIRCUIT

(75) Inventors: Randolph W. Chan, Lexington, MA (US); Kevin P. Oliver, Reading, MA (US)

(73) Assignee: Konarka Technologies, Inc., Lowell, MA (US)

( * ) Notice: Subject to any disclaimer, the term of this patent is extended or adjusted under 35 U.S.C. 154(b) by 870 days.

(21) Appl. No.: 11/503,605

(22) Filed: Aug. 14, 2006

(65) Prior Publication Data

US 2007/0113885 A1   May 24, 2007

Related U.S. Application Data

(60) Provisional application No. 60/708,170, filed on Aug. 15, 2005.

(51) Int. Cl.
*H01L 31/042* (2006.01)
*H01L 31/00* (2006.01)

(52) U.S. Cl. ........ 136/256; 136/252; 136/258; 136/259; 136/261; 136/262; 136/263; 136/264; 136/265

(58) Field of Classification Search .......... 136/251–252, 136/256, 259, 258, 261–265
See application file for complete search history.

(56) References Cited

U.S. PATENT DOCUMENTS

| | | | |
|---|---|---|---|
| 4,713,493 A | 12/1987 | Ovshinsky | |
| 5,021,099 A | 6/1991 | Kim et al. | |
| 5,074,920 A * | 12/1991 | Gonsiorawski et al. | 136/244 |
| 5,322,572 A | 6/1994 | Wanlass | |
| 5,380,371 A * | 1/1995 | Murakami | 136/256 |
| 5,421,908 A | 6/1995 | Yoshida et al. | |
| 6,239,352 B1 | 5/2001 | Luch | |
| 6,278,055 B1 | 8/2001 | Forrest et al. | |
| 6,706,963 B2 * | 3/2004 | Gaudiana et al. | 136/263 |
| 6,924,427 B2 | 8/2005 | Eckert et al. | |
| 2002/0134422 A1 * | 9/2002 | Bauman et al. | 136/244 |
| 2003/0127128 A1 * | 7/2003 | Fabick et al. | 136/256 |
| 2003/0230337 A1 | 12/2003 | Gaudiana et al. | |
| 2004/0187911 A1 * | 9/2004 | Gaudiana et al. | 136/252 |
| 2005/0274408 A1 | 12/2005 | Li et al. | |

FOREIGN PATENT DOCUMENTS

| | | |
|---|---|---|
| JP | 2755281 | 3/1998 |
| JP | 2939075 | 6/1999 |
| JP | 3103737 | 8/2000 |

OTHER PUBLICATIONS

English translation "Submission of Publications", submitted in Japanese Application No. 2008-527036 (Japanese counterpart to U.S. Appl. No. 11/503,605), dated Jul. 6, 2009.

* cited by examiner

*Primary Examiner* — Basia Ridley
*Assistant Examiner* — Lindsey Bernier
(74) *Attorney, Agent, or Firm* — Fish & Richardson P.C.

(57) ABSTRACT

Photovoltaic cells with interconnects to an external circuit, as well as related components, systems, and methods, are disclosed.

31 Claims, 2 Drawing Sheets

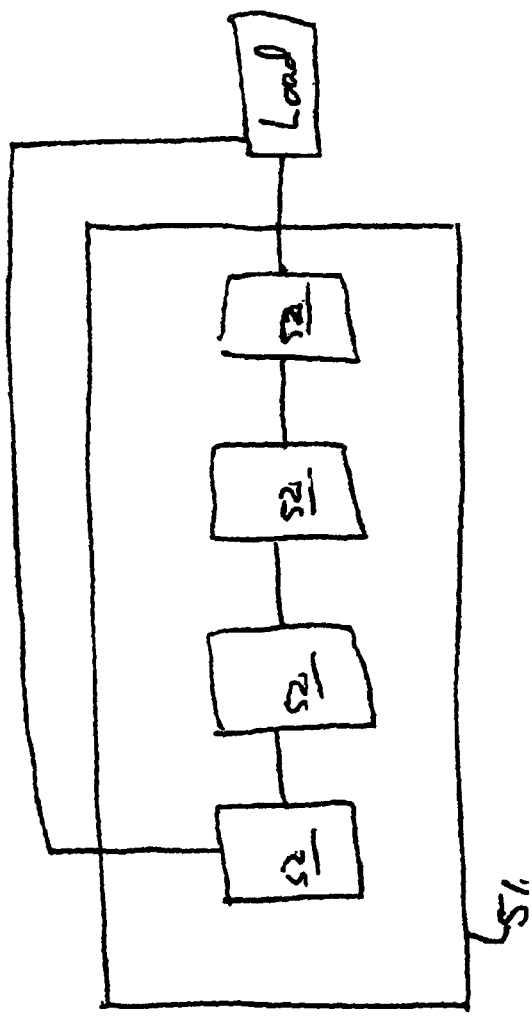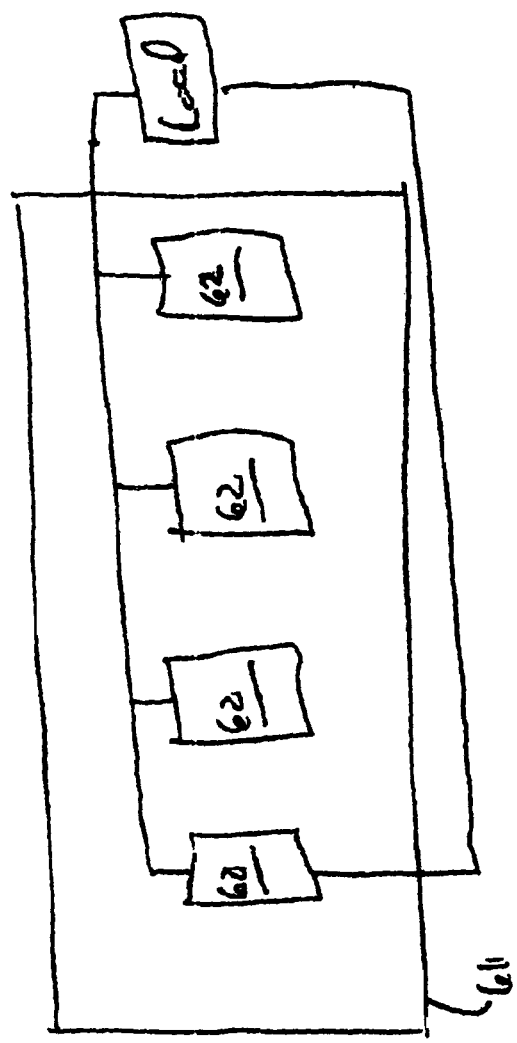

PHOTOVOLTAIC CELLS WITH INTERCONNECTS TO EXTERNAL CIRCUIT

CROSS REFERENCE TO RELATED APPLICATION

This application claims priority to U.S. Provisional Application Ser. No. 60/708,170, filed on Aug. 15, 2005, the contents of which are incorporated herein by reference.

TECHNICAL FIELD

This invention relates to photovoltaic cells with interconnects to an external circuit, as well as related components, systems, and methods.

BACKGROUND

Photovoltaic cells can be used to convert solar energy to electrical energy. Such cells generally include a photoactive layer disposed between two electrodes. Generally, light passes through one or both of the electrodes to interact with the photoactive layer to convert solar energy to electrical energy.

SUMMARY

In one aspect, the invention features a system containing first and second electrodes, a photoactive layer between the first and second electrodes, an electrically conductive layer electrically connected with the first electrode, and a first substrate between the electrically conductive layer and the first electrode. The first electrode is configured to be electrically connected to an external load through the electrically conductive layer. The system is configured as a photovoltaic cell.

In another aspect, the invention features a system containing first and second electrodes, a photoactive layer between the first and second electrodes, a circuit electrically connected with the first electrode, a first substrate having at least one opening between the circuit and the first electrode, and an electrically conductive material disposed in the opening. The circuit is electrically connected to the first electrode via the electrically conductive material. The system is configured as a photovoltaic cell.

Embodiments can include one or more of the following features.

The electrically conductive layer can include brass, tinned copper, tinned stainless steel, or tinned nickel.

The electrically conductive layer can be in the shape of a ribbon or a mesh.

The electrically conductive layer can include a bus.

The circuit can include at least a portion of an electrical device, such as a power plug, a battery charger, a cell phone charger, or a power supply.

The electrically conductive layer or the circuit can be electrically connected to the first electrode through an electrically conductive adhesive material disposed in an opening in the first substrate. In some embodiments, the electrically conductive adhesive material includes a polymer impregnated with a metal.

The electrically conductive layer or the circuit can be electrically connected to the first electrode further through a metal disk. In some embodiments, the metal disk includes titanium, stainless steel, palladium, platinum, copper, tin, aluminum, indium, gold, silver, nickel, or an alloy thereof.

The electrically conductive layer or the circuit can be electrically connected to the first electrode through an electrically conductive pad disposed in an opening in the first substrate. In some embodiments, the electrically conductive pad includes a polymer containing a metal spring or carbon. The polymer can include rubber, silicone, or a curable elastomeric polymer. The metal spring can include steel, silver, titanium, or an alloy thereof.

The electrically conductive layer or the circuit can be electrically connected to the first electrode through a low melting metal or alloy disposed in an opening in the first substrate.

The electrically conductive layer or the circuit can be electrically connected with the first electrode at two or more locations on the first electrode.

The electrically conductive layer or the circuit can be disposed between the first electrode and a second substrate. In some embodiments, the first or second substrate includes a polymer selected from the group consisting of polyethylene naphthalates, polyethylene terephthalates, polyethyelenes, polypropylenes, polyamides, polyimides, cellulosic polymers, polyethers, polyether ketones, polymethylmethacrylate, polycarbonate, polyurethanes, and combinations thereof.

The system can further include a first adhesive layer between the first substrate and the first electrode, and a second adhesive layer between the first substrate and the electrically conductive layer or the circuit. In some embodiments, the first or second adhesive layer includes epoxies, polyurethanes, polyureas, polyesters, styrene acrylonitrile copolymers, polyethylene-based polymers, or polypropylene-based polymers.

The first electrode can include a metal foil. In some embodiments, the metal foil includes titanium, stainless steel, palladium, platinum, copper, aluminum, indium, gold, silver, nickel, or an alloy thereof.

The photoactive material can include an electron donor material and an electron acceptor material. In some embodiments, the electron acceptor material includes a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof. In some embodiments, the electron donor material includes a material selected from the group consisting of discotic liquid crystals, polythiophenes, polyphenylenes, polyphenylvinylenes, polysilanes, polythienylvinylenes, and polyisothianaphthalenes.

The photoactive material can include a photosensitized interconnected nanoparticle material. In some embodiments, the photosensitized interconnected nanoparticle material includes a material selected from the group consisting of selenides, sulfides, tellurides, titanium oxides, tungsten oxides, zinc oxides, zirconium oxides, and combinations thereof.

The photoactive material can include amorphous silicon or CIGS.

Embodiments can provide one or more of the following advantages.

In some embodiments, the electrically conductive layer can include a solderable surface, for example, by including a coating of tin on a surface. The solderable surface can be used to reliably connect the photovoltaic cell to an external load. Further, a coating of tin can minimize oxidation of any joint between the photovoltaic cell and the external load, thereby improving the reliability of the electrical connection.

In some embodiments, the metal disk can provide a good surface for the electrically conductive adhesive material to adhere to. Further, the metal disk can include a solderable surface (e.g., by including a coating of tin on the surface) to reliably connecting the first electrode to the electrically conductive layer or the circuit.

Other features and advantages of the invention will be apparent from the description, drawings and claims.

DESCRIPTION OF DRAWINGS

FIG. 2 is a schematic of a system containing multiple photovoltaic cells electrically connected in series.

FIG. 3 is a schematic of a system containing multiple photovoltaic cells electrically connected in parallel.

Like reference symbols in the various drawings indicate like elements.

DETAILED DESCRIPTION

Figure 1:
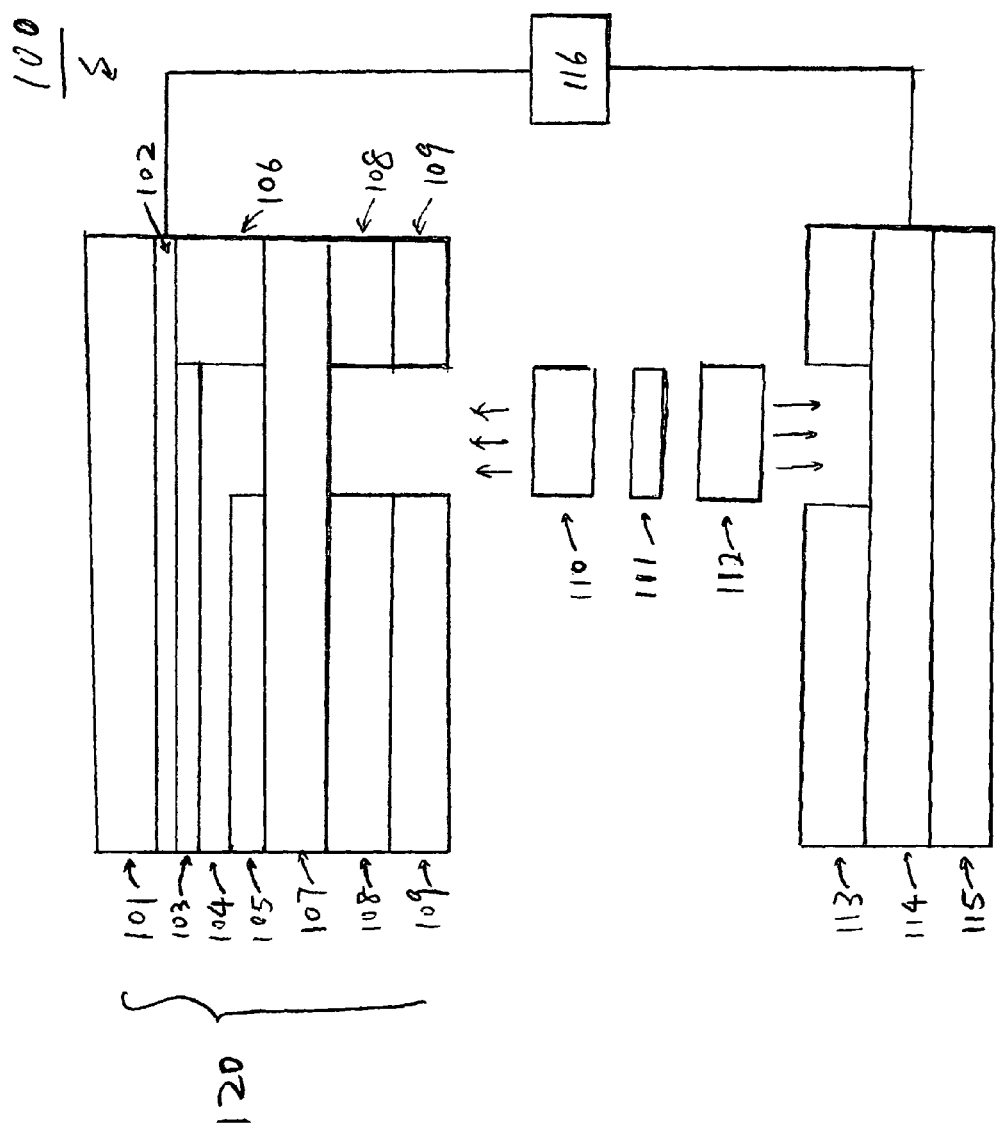
FIG. 1 is a cross-sectional view of an embodiment of a photovoltaic cell.

In general, this disclosure relates to photovoltaic cells with interconnects to an external circuit.

In some embodiments, the photovoltaic cells can be dye sensitized solar cell (DSSCs). Referring to FIG. 1, a system 100 include a DSSC 120 that contains a charge carrier layer 104 (e.g., including an electrolyte, such as an iodide/iodine solution) and a photoactive layer 105 (e.g., including a semiconductor material, such as $TiO_2$ particles) disposed between an electrode 102 (e.g., an ITO layer or tin oxide layer) and an electrode 107 (e.g., a metal foil) via an adhesive material 106. Photoactive layer 105 also includes a photosensitizing agent, such as a dye. In general, the photosensitizing agent is capable of absorbing photons within a wavelength range of operation (e.g., within the solar spectrum). DSSC 120 also includes a catalytic layer 103 (e.g., containing platinum) disposed between electrode 102 and charge carrier layer 104, which catalyzes a redox reaction in charge carrier layer 104. DSSC 120 also includes two substrates 101 and 109. Electrode 102 is disposed on an inner surface of substrate 101 and electrode 107 is disposed on an inner surface of substrate 109.

In some embodiments, electrode 107 is electrically connected to external load 116 via an electrically conductively layer 114. In some embodiments, electrically conductive layer is formed of a highly conductively material. Examples of such highly conductive materials include solderable alloys, such as brass, tinned copper, tinned stainless steel, or tinned nickel. In some embodiments, electrically conductive layer 114 is in the shape of a ribbon or a mesh. In some embodiments, electrically conductive layer 114 is in the form of a bus. In some embodiments, electrically conductive layer 114 is coated with tin on a surface so that it can be used to reliably connect DSSC 120 to an external load. Further, the tinned surface can minimize oxidation of any joint between DSSC 120 and the external load, thereby improving the reliability of the electrical connection.

Electrically conductive layer 114 can be disposed on substrate 115. Substrate 115 can be formed of a material the same as or different from the material used to form substrates 101 and 109. In some embodiments, electrically conductive 114 is attached to substrate 109 via an adhesive layer 113. Examples of materials that can be used to prepare adhesive layer 113 include epoxies, polyurethanes, polyureas, polyesters, styrene-acrylonitrile copolymers, polyethylene-based polymers, or polypropylene-based polymers.

In some embodiments, electrode 107 can be disposed on an inner surface of substrate 109 via an adhesive layer 108. Adhesive layer 108 can be formed of a material the same as or different from the material used to form adhesive layer 113.

In some embodiments, electrode 107 is connected to electrically conductive layer 114 via an electrically conductive adhesive material 110. Examples of materials that can be used to prepare electrically conductive adhesive material 110 include a polymer impregnated with a metal. The polymer can be a polyester, a polyurethane, or an epoxy polymer. The metal can be in the form of flakes (e.g., silver flakes). In some embodiments, electrically conductive adhesive material 110 can be in a dry form or in a liquid form. For example, electrically conductive adhesive material 110 can include a polymer (e.g., a polyester) and metal flakes (e.g., silver flakes) suspended in a solvent (e.g., toluene or methyl ethyl ketone). In some embodiments, electrically conductive adhesive material 110 can include a polymer modified for better mixing with the metal, for better flexibility, or for curing at a certain condition.

Electrically conductive adhesive material 110 can be disposed in an opening in adhesive layer 108, substrate 109, and adhesive layer 113 so that it electrically connects electrode 107 and electrically conductive layer 114. The opening can be prepared by a cutting tool, such as a laser or a water jet. The cutting tool can remove portions of adhesive layer 108 and substrate 109 to expose electrode 107 and remove portions of adhesive layer 113 to expose electrically conductive layer 114. When electrode 107 is a metal foil, the cutting tool can also remove an oxide layer on the metal foil. In some embodiments, the opening can have a diameter of at least 1 mm (e.g., at least 3 mm, at least 5 mm, at least 10 mm).

In some embodiments, electrode 107 can be electrically connected to electrically conductive layer 114 further through a metal disk 111. Examples of metals that can be used to form disk 111 include titanium, stainless steel, palladium, platinum, copper, tin, aluminum, indium, gold, silver, nickel, or an alloy thereof. The metal disk can provide a good surface for the electrically conductive adhesive material to adhere to. In some embodiments, the metal disk can include a solderable surface, for example, by including a coating of tin on the surface, to reliably connecting electrode 107 to electrically conductive layer 114.

Optionally, electrode 107 can be connected to electrically conductive layer 114 further through adhesive material 112. Adhesive material 112 can be formed of a material the same as or different from that used to form adhesive material 110. In some embodiments, electrode 107 is electrically connected to electrically conductive layer 114 through adhesive material 110 disposed in the opening in adhesive layer 108 and substrate 109, adhesive material 112 disposed in the opening in adhesive layer 113, and metal disk 111 disposed between adhesive materials 110 and 112.

In some embodiments, an electrically conductive pad can be used in lieu of adhesive materials 110 and 112, and metal disk 111 to electrically connect electrode 107 and electrically conductively layer 114. The electrically conductive pad can include a polymer impregnated with an electrically conductive material. Examples of the polymer include rubber, silicone, or a curable elastomeric polymer. In some embodiments, the polymer can be in a compressed form. Examples of the electrically conductive material that can be used in the pad include one or more metal springs or carbon. Metal springs can be formed of steel, silver, titanium, or an alloy thereof, or any other suitable metals or alloys. The electrically conductive pad can be disposed in the opening in adhesive layer 108, substrate 109, and adhesive layer 113 to facilitate electron transportation between electrode 107 and electrically conductive layer 114.

In some embodiments, electrode 107 can be electrically connected to electrically conductive layer 114 through a low melting metal (e.g., tin or lead) or alloy (e.g., a solder) disposed in the opening in adhesive layer 108, substrate 109, and adhesive layer 113.

Electrically conductive layer 114 can be electrically connected to electrode 107 at one or more locations. Without wishing to be bound by theory, it is believed that connecting electrode 107 at multiple locations with electrically conductive layer 114 can significantly improve the efficiency of electron transportation from foil 107 to external load 116. In some embodiments, external load 116 can be a power plug, a battery charger, a cell phone charger, or a power supply.

In some embodiments, adhesive material 106, adhesive layers 108 and 113, and electrically conductive adhesive materials 110 and 112 can be disposed in DSSC 120 as a paste. Optionally, they can be dried or cured after they are disposed.

In some embodiments, electrically conductive layer 114 can be replaced with a circuit. The circuit can include a portion of an electrical device, such as a power plug, a battery charger, a cell phone charger, or a power supply.

During operation, in response to illumination by radiation (e.g., in the solar spectrum), DSSC 120 undergoes cycles of excitation, oxidation, and reduction that produce a flow of electrons across external load 116. Incident light excites photosensitizing agent molecules in photoactive layer 105. The photoexcited photosensitizing agent molecules then inject electrons into the conduction band of the semiconductor in photoactive layer 105, which leaves the photosensitizing agent molecules oxidized. The injected electrons flow to external load 116 through electrode 107, adhesive material 110, metal disk 111, adhesive material 112, and electrically conductive layer 114. After flowing through external load 116, the electrons flow to electrode 102, then to catalytic layer 103, and subsequently to charge carrier layer 104, where the electrons reduce the electrolyte material in charge carrier layer 104 at catalytic layer 103. The reduced electrolyte can then reduce the oxidized photosensitizing agent molecules back to their neutral state. The electrolyte in charge carrier layer 104 can act as a redox mediator to control the flow of electrons from electrode 107 to electrode 102. This cycle of excitation, oxidation, and reduction is repeated to provide continuous electrical energy to external load 116.

Turning to other components in DSSC 120, photoactive layer 105 can include a photosensitizing agent, such as a dye. In some embodiments, photoactive layer 105 can include a plurality of dyes with different color at different regions. In general, the color of each region is determined by the particular dye (or combination of dyes) contained within the given region. Examples of dyes include black dyes (e.g., tris (isothiocyanato)-ruthenium (II)-2,2':6',2"-terpyridine-4,4', 4"-tricarboxylic acid, tris-tetrabutylammonium salt), orange dyes (e.g., tris(2,2'-bipyridyl-4,4'-dicarboxylato) ruthenium (II) dichloride, purple dyes (e.g., cis-bis(isothiocyanato)bis-(2,2'-bipyridyl-4,4'-dicarboxylato)-ruthenium (II)), red dyes (e.g., an eosin), green dyes (e.g., a merocyanine) and blue dyes (e.g., a cyanine). Examples of additional dyes include cyanines, xanthenes, anthraquinones, merocyanines, phenoxazinones, indolines, thiophenes, coumarins, anthocyanines, porphyrins, phthalocyanines, squarates, squarylium dyes, and certain metal-containing dyes. Combinations of dyes can also be used within a given region so that a given region can include more than one (e.g., two, three, four, five, six, seven) different dyes.

In some embodiments, photoactive layer 105 can include a dye having a formula cis-RuLL'(NCS)$_2$, in which L can include a first 2,2'-bipyridyl and L' can include a second 2,2'-bipyridyl. The first 2,2'-bipyridyl can be the same as or can be different from the second 2,2'-bipyridyl. The term "2,2'-bipyridal" mentioned herein includes both substituted and unsubstituted moieties. Examples of substituents include $C_1$-$C_{10}$ alkyl, $C_2$-$C_{10}$ alkenyl, $C_2$-$C_{10}$ alkynyl, $C_3$-$C_8$ cycloalkyl, $C_5$-$C_8$ cycloalkenyl, $C_1$-$C_{10}$ alkoxy, aryl, aryloxy, heteroaryl, heteroaryloxy, amino, $C_1$-$C_{10}$ alkylamino, $C_1$-$C_{20}$ dialkylamino, arylamino, diarylamino, heteroarylamino, diheteroarylamino, $C_1$-$C_{10}$ alkylsulfonyl, arylsulfonyl, heteroarylsulfonyl, $C_1$-$C_{10}$ alkylsulfonamide, arylsulfonamide, heteroarylsulfonamide, hydroxyl, halogen, mercapto, $C_1$-$C_{10}$ alkylmercapto, arylmercapto, cyano, nitro, acyl, acyloxy, carboxyl, amido, carbamoyl, and carboxylic ester. Cycloalkyl, heterocycloalkyl, aryl, and heteroaryl also include fused groups.

An example of cis-RuLL'(NCS)$_2$ is cis-Ru(4,4'-dicarboxylic acid-2,2'-bipyridyl)(4,4'-dinonyl-2,2'-bipyridyl)(NCS)$_2$ (Z907). In certain embodiments, Z907 is first dissolved in a suitable organic solvent to form a dye solution. The organic solvent typically has low vapor pressure (e.g., <10 mmHg at 20° C.), good dye solubility (e.g., dissolving more than 5 mM of the dye), high permittivity and wettability to the semiconductor material in a photoactive layer (e.g., TiO$_2$ nanoparticles), thereby facilitating dye absorbance to the semiconductor material and reducing the dyeing time. Examples of such organic solvents include g-butyrolactone, 1-methoxy-2-propanol, N,N-dimethyl formamide, N,N-dimethylacetamide, propylene glycol phenyl ether, and a mixture thereof. The dye solution can then be applied to a semiconductor material by one or more methods disclosed herein. The dyeing process using such a dye solution can have a relatively short dyeing time. In certain embodiments, by using a dyeing solution mentioned above, 65 mg of Z907 can be absorbed onto 1 g of the semiconductor material in at most about 5 minutes, (e.g., at most about 4 minutes, at most about 3 minutes, at most about 2 minutes, or at most about 1 minute).

In some embodiments, a thickening agent can be added to a solution containing a dye (e.g., a ruthenium based dye such as Z907 or an organic dye). The thickening agent can reduce the dyeing time. It can also be used to adjust the rheology (e.g., the viscosity) of the dye solution by using different concentrations. Exemplary thickening agents include dispensible fumed silica particles and poly(propylene glycol). After the dye is absorbed onto a semiconductor material, the thickening agent can be optionally removed by washing the semiconductor material with an organic solvent (e.g., ethanol or 1-methoxy-2-propanol).

In some embodiments, the fumed silica particles can be modified to form a hydrophobic surface. For example, the surface of the fumed silica particles can be modified with poly(dimethyl siloxane) moieties. An example of such a hydrophobic silica is CAB-O-SIL TS-720 manufactured by CABOT CORPORATION. Hydrophobic silica particles can improve the thermal stability of a photovoltaic cell. Without wishing to be bound by theory, it is believed that hydrophobic silica particles can minimize the contact between the dye and the electrolyte in the photovoltaic cell, thereby reducing dye desorption.

Photoactive layer 105 also includes an additional material, such as a semiconductor material, that is associated with the dyes. Examples of semiconductor materials include materials having the formula $M_xO_y$, where M may be, for example, titanium, zirconium, tungsten, niobium, lanthanum, tantalum, terbium, or tin and x and y are integers greater than zero. Other suitable materials include sulfides, selenides, tellurides, and oxides of titanium, zirconium, tungsten, niobium, lanthanum, tantalum, terbium, tin, or combinations thereof. For example, $TiO_2$, $SrTiO_3$, $CaTiO_3$, $ZrO_2$, $WO_3$, $La_2O_3$, $Nb_2O_5$, $SnO_2$, sodium titanate, cadmium selenide (CdSe), cadmium sulphides, and potassium niobate may be suitable materials.

Typically, the semiconductor material contained within photoactive layer 105 is in the form of nanoparticles. In some embodiments, the nanoparticles have an average size between about two nm and about 100 nm (e.g., between about 10 nm and 40 nm, such as about 20 nm).

The nanoparticles can be interconnected, for example, by high temperature sintering, or by a reactive polymeric linking agent, such as poly(n-butyl titanate). A polymeric linking agent can enable the fabrication of an interconnected nanoparticle layer at relatively low temperatures (e.g., less than about 300° C.) and in some embodiments at room temperature. The relatively low temperature interconnection process may be amenable to continuous manufacturing processes using polymer substrates.

The interconnected nanoparticles are generally photosensitized by the dye(s). The dyes facilitates conversion of incident light into electricity to produce the desired photovoltaic effect. It is believed that a dye absorbs incident light resulting in the excitation of electrons in the dye. The energy of the excited electrons is then transferred from the excitation levels of the dye into a conduction band of the interconnected nanoparticles. This electron transfer results in an effective separation of charge and the desired photovoltaic effect. Accordingly, the electrons in the conduction band of the interconnected nanoparticles are made available to drive an external load.

The dye(s) can be sorbed (e.g., chemisorbed and/or physisorbed) on the nanoparticles. A dye can be selected, for example, based on its ability to absorb photons in a wavelength range of operation (e.g., within the visible spectrum), its ability to produce free electrons (or electron holes) in a conduction band of the nanoparticles, its effectiveness in complexing with or sorbing to the nanoparticles, and/or its color.

The composition and thickness of electrode 102 is generally selected based on desired electrical conductivity, optical properties, and/or mechanical properties of the layer. In some embodiments, electrode 102 is transparent. Examples of transparent materials suitable for forming such a layer include certain metal oxides, such as indium tin oxide (ITO), tin oxide, and a fluorine-doped tin oxide. In some embodiments, electrode 102 can be formed of a foil (e.g., a titanium foil). Electrode 102 may be, for example, between about 100 nm and 500 nm thick, (e.g., between about 150 nm and 300 nm thick).

In some embodiments, electrode 102 can include a discontinuous layer of a conductive material. For example, electrode 102 can include an electrically conducting mesh. Suitable mesh materials include metals, such as palladium, titanium, platinum, stainless steels and alloys thereof. In some embodiments, the mesh material includes a metal wire. The electrically conductive mesh material can also include an electrically insulating material that has been coated with an electrically conducting material, such as a metal. The electrically insulating material can include a fiber, such as a textile fiber or monofilament. Examples of fibers include synthetic polymeric fibers (e.g., nylons) and natural fibers (e.g., flax, cotton, wool, and silk). The mesh electrode can be flexible to facilitate, for example, formation of the DSSC by a continuous manufacturing process. Photovoltaic cells having mesh electrodes are disclosed, for example, in co-pending U.S. Patent Application Publication Number 2003/0230337, U.S. Patent Application Publication Number 2004/0187911, and International Patent Application Publication Number WO 03/04117, each of which is hereby incorporated by reference.

The mesh electrode may take a wide variety of forms with respect to, for example, wire (or fiber) diameters and mesh densities (i.e., the number of wires (or fibers) per unit area of the mesh). The mesh can be, for example, regular or irregular, with any number of opening shapes. Mesh form factors (such as, e.g., wire diameter and mesh density) can be chosen, for example, based on the conductivity of the wire (or fibers) of the mesh, the desired optical transmissivity, flexibility, and/or mechanical strength. Typically, the mesh electrode includes a wire (or fiber) mesh with an average wire (or fiber) diameter in the range from about one micron to about 400 microns, and an average open area between wires (or fibers) in the range from about 60% to about 95%.

Catalyst layer 103 is generally formed of a material that can catalyze a redox reaction in the charge carrier layer positioned below. Examples of materials from which catalyst layer can be formed include platinum and poly(3,4-ethylenedioxythiophene) (PEDOT). PEDOT layers are discussed in U.S. Ser. No. 60/495,302, which is hereby incorporated by reference. Materials can be selected based on criteria such as, e.g., their compatibility with manufacturing processes, long term stability, and optical properties. In general, the catalyst layer is substantially transparent. However, in certain embodiments, (e.g., embodiments in which the cathodes are substantially transparent) the catalyst layer can be substantially opaque.

Substrate 101 can be formed from a mechanically-flexible material, such as a flexible polymer, or a rigid material, such as a glass. Examples of polymers that can be used to form a flexible substrate include polyethylene naphthalates, polyethylene terephthalates, polyethyelenes, polypropylenes, polyamides, polyimides, cellulosic polymers, polyethers, polyether ketones, polymethylmethacrylate, polycarbonate, polyurethanes, and combinations thereof. Flexible substrates can facilitate continuous manufacturing processes such as web-based coating and lamination.

The thickness of substrate 101 can vary as desired. Typically, substrate thickness and type are selected to provide mechanical support sufficient for the DSSC to withstand the rigors of manufacturing, deployment, and use. Substrate 101 can have a thickness of from about six microns to about 5,000 microns (e.g., from about 6 microns to about 50 microns, from about 50 microns to about 5,000 microns, from about 100 microns to about 1,000 microns).

In embodiments where electrode 102 is transparent, substrate 101 is formed from a transparent material. For example, substrate 101 can be formed from a transparent glass or polymer, such as a silica-based glass or a polymer, such as those listed above.

Substrate 109 and electrode 107 can be similar to substrate 101 and electrode 102, respectively. For example, substrate 109 can be formed from the same materials and can have the same thickness as substrate 101. In some embodiments however, it may be desirable for substrate 109 to be different from 101 in one or more aspects. For example, where the DSSC is manufactured using a process that places different stresses on the different substrates, it may be desirable for substrate 109 to be more or less mechanically robust than substrate 101. Accordingly, substrate 109 may be formed from a different material, or may have a different thickness that substrate 101. Furthermore, in embodiments where only one substrate is exposed to an illumination source during use, it is not necessary for both substrates and/or electrically conducting layers to be transparent. Accordingly, one of substrates and/or corresponding electrically conducting layer can be opaque. For example, electrode 107 can be formed of a metal foil. In some embodiments, the metal foil includes titanium, stainless steel, palladium, platinum, copper, aluminum, indium, gold, silver, nickel, or an alloy thereof.

Further, substrate 115 can be similar to substrates 101 and 109. For example, substrate 115 can be formed from the same materials and can have the same thickness as substrates 101 and 109.

As discussed previously, charge carrier layer 104 includes a material that facilitates the transfer of electrical charge from a ground potential or a current source to photoactive layer 105. A general class of suitable charge carrier materials include solvent-based liquid electrolytes, polyelectrolytes, polymeric electrolytes, solid electrolytes, n-type and p-type transporting materials (e.g., conducting polymers) and gel electrolytes. Other choices for charge carrier media are possible. For example, the charge carrier layer can include a lithium salt that has the formula LiX, where X is an iodide, bromide, chloride, perchlorate, thiocyanate, trifluoromethyl sulfonate, or hexafluorophosphate.

The charge carrier media typically includes a redox system. Suitable redox systems may include organic and/or inorganic redox systems. Examples of such systems include cerium(III) sulphate/cerium(IV), sodium bromide/bromine, lithium iodide/iodine, $Fe^{2+}/Fe^{3+}$, $Co^{2+}/Co^{3+}$, and viologens. Furthermore, an electrolyte solution may have the formula $M_iX_j$, where i and j are greater than or equal to one, where X is an anion, and M is lithium, copper, barium, zinc, nickel, a lanthanide, cobalt, calcium, aluminum, or magnesium. Suitable anions include chloride, perchlorate, thiocyanate, trifluoromethyl sulfonate, and hexafluorophosphate.

In some embodiments, the charge carrier media includes a polymeric electrolyte. For example, the polymeric electrolyte can include poly(vinyl imidazolium halide) and lithium iodide and/or polyvinyl pyridinium salts. In embodiments, the charge carrier media can include a solid electrolyte, such as lithium iodide, pyridimum iodide, and/or substituted imidazolium iodide.

The charge carrier media can include various types of polymeric polyelectrolytes. For example, suitable polyelectrolytes can include between about 5% and about 95% (e.g., 5-60%, 5-40%, or 5-20%) by weight of a polymer, e.g., an ion-conducting polymer, and about 5% to about 95% (e.g., about 35-95%, 60-95%, or 80-95%) by weight of a plasticizer, about 0.05 M to about 10 M of a redox electrolyte of organic or inorganic iodides (e.g., about 0.05-2 M, 0.05-1 M, or 0.05-0.5 M), and about 0.01 M to about 1 M (e.g., about 0.05-0.5 M, 0.05-0.2 M, or 0.05-0.1 M) of iodine. The ion-conducting polymer may include, for example, polyethylene oxide (PEO), polyacrylonitrile (PAN), polymethylmethacrylate (PMMA), polyethers, and polyphenols. Examples of suitable plasticizers include ethyl carbonate, propylene carbonate, mixtures of carbonates, organic phosphates, butyrolactone, and dialkylphthalates.

DSSC 120 can be prepared by a continuous manufacturing process, such as roll-to-roll or web processes. Examples of roll-to-roll processes have been described in, for example, U.S. Application Publication Nos. 2005/0263179 and 2006/0130895.

Multiple photovoltaic cells can be electrically connected to form a photovoltaic system. As an example, FIG. 2 is a schematic of a photovoltaic system 50 having a module 51 containing photovoltaic cells 52. Cells 52 are electrically connected in series, and system 50 is electrically connected to a load. As another example, FIG. 3 is a schematic of a photovoltaic system 60 having a module 61 that contains photovoltaic cells 62. Cells 62 are electrically connected in parallel, and system 60 is electrically connected to a load. In some embodiments, some (e.g., all) of the photovoltaic cells in a photovoltaic system can have one or more common substrates. In certain embodiments, some photovoltaic cells in a photovoltaic system are electrically connected in series, and some of the photovoltaic cells in the photovoltaic system are electrically connected in parallel.

While certain embodiments have been described, other embodiments are possible.

As an example, while embodiments of DSSCs have been described, other types of photovoltaic cells are also possible. Examples of such photovoltaic cells include organic photovoltaic cells, amorphous silicon solar cells, copper indium gallium arsenide solar cells, cadmium selenide solar cells, cadmium telluride solar cells, copper indium sulfide solar cells, and/or tandem cells.

For example, in an organic photovoltaic cell, catalytic layer 103, charge carrier layer 104, and photoactive layer 105 described above can be replaced with a hole carrier layer, a photoactive layer, and a hole blocking layer, respectively.

In some embodiments, the photoactive layer in an organic photovoltaic cell can include an electron donor material and an electron donor material. Examples of electron donor materials include discotic liquid crystal, polythiophenes, polyphenylenes, poly(phenylene-vinylene)s, polythienylvinylenes, polyisothianaphthalenes, and combinations thereof. Examples of electron acceptor materials include fullerenes, inorganic nanoparticles (e.g., nanoparticles formed of zinc oxide, tungsten oxide, indium phosphide, cadmium selenide and/or lead sulphide), oxadiazoles, discotic liquid crystals, carbon nanorods, inorganic nanorods (e.g., nanorods formed of zinc oxide, tungsten oxide, indium phosphide, cadmium selenide and/or lead sulphide), or polymers containing moieties capable of accepting electrons or forming stable anions (e.g., polymers containing CN groups or polymers containing $CF_3$ groups), and combinations thereof. In some embodiments, at least some of the electron donor materials in photoactive layer have a different color. For example, the photoactive layer can include at least three different electron donor materials, each having a different color.

A hole carrier layer in an organic photovoltaic cell is generally formed of a material that, at the thickness used in photovoltaic cell, transports holes to electrode 102 and substantially blocks the transport of electrons to electrode 102. Examples of materials from which a hole carrier layer can be formed include polythiophenes (e.g., PEDOT), polyanilines, polyvinylcarbazoles, polyphenylenes, polyphenylvinylenes, polysilanes, polythienylenevinylenes and/or polyisothianaphthanenes. In some embodiments, a hole carrier layer can include combinations of hole carrier materials.

A hole blocking layer in an organic photovoltaic cell is generally formed of a material that, at the thickness used in the photovoltaic cell, transports electrons to electrode 107 and substantially blocks the transport of holes to electrode 107. Examples of materials from which a hole blocking layer can be formed include LiF and metal oxides (e.g., zinc oxide, titanium oxide).

Examples of organic photovoltaic cells are described, for example, in U.S. Patent Application Publication Number 2004/0187911, and co-pending an commonly owned U.S. Ser. No. 60/576,033, both of which are hereby incorporated by reference.

Multiple organic photovoltaic cells can be electrically connected (e.g., as described above).

Other embodiments are in the claims.

What is claimed is:

1. A system, comprising:
   first and second electrodes;
   a photoactive layer between the first and second electrodes;
   an electrically conductive layer electrically connected with the first electrode;
   a first substrate between the electrically conductive layer and the first electrode, the first substrate having an opening;
   a first adhesive layer between the first substrate and the electrically conductive layer, the first adhesive layer having an opening; and
   an electrically conductive member that is electrically connected to both the first electrode and the electrically conductive layer, the electrically conductive member being in both the opening of the first substrate and the opening of the first adhesive layer,
   wherein the electrically conductive layer is a continuous layer without openings and comprises an electrically conductive material distributed continuously throughout the entire electrically conductive layer, the electrically conductive member is entirely disposed between the first electrode and the electrically conductive layer, the first electrode is configured to be electrically connected to an external load via both the electrically conductive member and the electrically conductive layer, and the system is configured as a photovoltaic cell.

2. The system of claim 1, wherein the electrically conductive layer comprises brass, tinned copper, tinned stainless steel, or tinned nickel.

3. The system of claim 1, wherein the electrically conductive layer is in the shape of a ribbon or a mesh.

4. The system of claim 1, wherein the electrically conductive layer comprises a bus.

5. The system of claim 1, wherein the electrically conductive member comprises a first electrically conductive adhesive material.

6. The system of claim 5, wherein the first electrically conductive adhesive material comprises a polymer impregnated with a metal.

7. The system of claim 5, wherein the electrically conductive member further comprises a metal disk.

8. The system of claim 7, wherein the metal disk comprises titanium, stainless steel, palladium, platinum, copper, tin, aluminum, indium, gold, silver, nickel, or an alloy thereof.

9. The system of claim 1, wherein the electrically conductive member comprises an electrically conductive pad.

10. The system of claim 9, wherein the electrically conductive pad comprises a polymer containing a metal spring or carbon.

11. The system of claim 10, wherein the polymer comprises rubber, silicone, or a curable elastomeric polymer.

12. The system of claim 1, wherein the electrically conductive member comprises a low-melting metal or alloy.

13. The system of claim 1, wherein the electrically conductive layer is electrically connected with the first electrode at two or more locations on the first electrode.

14. The system of claim 1, further comprising a second substrate, wherein the electrically conductive layer is disposed between the first substrate and the second substrate.

15. The system of claim 14, wherein the first or second substrate comprises a polymer selected from the group consisting of polyethylene terephthalates, polyimides, polyethylene naphthalates, polymeric hydrocarbons, cellulosic polymers, polycarbonates, polyamides, polyethers, polyether ketones, and combinations thereof.

16. The system of claim 1, further comprising a second adhesive layer between the first substrate and the first electrode.

17. The system of claim 16, wherein the first or second adhesive layer comprises epoxies, polyurethanes, polyureas, polyesters, styrene-acrylonitrile copolymers, polyethylene-based polymers, or polypropylene-based polymers.

18. The system of claim 1, wherein the first electrode comprises a metal foil.

19. The system of claim 18, wherein the metal foil comprises titanium, stainless steel, palladium, platinum, copper, aluminum, indium, gold, silver, nickel, or an alloy thereof.

20. The system of claim 1, wherein the photoactive material comprises an electron donor material and an electron acceptor material.

21. The system of claim 20, wherein the electron acceptor material comprises a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof.

22. The system of claim 20, wherein the electron donor material comprises a material selected from the group consisting of discotic liquid crystals, polythiophenes, polyphenylenes, polyphenylvinylenes, polysilanes, polythienylvinylenes, and polyisothianaphthalenes.

23. The system of claim 1, wherein the photoactive material comprises a photosensitized interconnected nanoparticle material.

24. The system of claim 23, wherein the photosensitized interconnected nanoparticle material comprises a material selected from the group consisting of selenides, sulfides, tellurides, titanium oxides, tungsten oxides, zinc oxides, zirconium oxides, and combinations thereof.

25. The system of claim 1, wherein the photoactive material comprises amorphous silicon or CIGS.

26. The system of claim 7, wherein the electrically conductive member further comprises a second electrically conductive adhesive material, and the metal disk is between the first and second electrically conductive adhesive materials.

27. The system of claim 16, wherein the second adhesive layer has an opening, and the electrically conductive member is disposed in the opening of the second adhesive layer.

28. The system of claim 27, wherein the electrically conductive member comprises a first electrically conductive adhesive material.

29. The system of claim 28, wherein the electrically conductive member further comprises a metal disk.

30. The system of claim 29, wherein the electrically conductive member further comprises a second electrically conductive adhesive material, and the metal disk is between the first and second electrically conductive adhesive materials.

31. The system of claim 30, further comprising a second substrate, wherein the electrically conductive layer is disposed between the first substrate and the second substrate.

* * * * *